US010388398B2

(12) United States Patent
Jeong et al.

(10) Patent No.: US 10,388,398 B2
(45) Date of Patent: Aug. 20, 2019

(54) MEMORY APPARATUS INCLUDING A COMMAND CONTROLLER

(71) Applicant: SAMSUNG ELECTRONICS CO., LTD., Suwon-si, Gyeonggi-Do (KR)

(72) Inventors: Jeong-Hwa Jeong, Asan-si (KR); Jeong-Yun Cha, Asan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/696,529

(22) Filed: Sep. 6, 2017

(65) Prior Publication Data

US 2018/0075927 A1 Mar. 15, 2018

(30) Foreign Application Priority Data

Sep. 9, 2016 (KR) ........................ 10-2016-0116571

(51) Int. Cl.
*G11C 29/50* (2006.01)
*G11C 11/403* (2006.01)
*G11C 7/04* (2006.01)
*G11C 11/406* (2006.01)
*G11C 29/06* (2006.01)

(52) U.S. Cl.
CPC ............... *G11C 29/50* (2013.01); *G11C 7/04* (2013.01); *G11C 11/403* (2013.01); *G11C 11/40615* (2013.01); *G11C 11/40626* (2013.01); *G11C 29/06* (2013.01); *G11C 29/50016* (2013.01)

(58) Field of Classification Search
CPC ... G11C 29/50; G11C 29/50016; G11C 29/06; G11C 11/40626; G11C 11/403; G11C 7/04; G11C 11/40615
See application file for complete search history.

(56) References Cited

U.S. PATENT DOCUMENTS

| 6,445,637 | B2 | 9/2002 | Nanba |
| 7,894,290 | B2 * | 2/2011 | Hoffmann ............. G11C 11/406 365/222 |
| 7,911,868 | B2 | 3/2011 | Lee |
| 8,023,353 | B2 | 9/2011 | Nakashima et al. |
| 8,325,550 | B2 * | 12/2012 | Teramoto ................. G11C 7/04 365/211 |
| 8,542,548 | B2 | 9/2013 | An |
| 8,553,485 | B2 | 10/2013 | Pyeon |
| 8,687,446 | B2 | 4/2014 | Lee |
| 9,261,555 | B2 | 2/2016 | Yoon et al. |
| 9,472,261 | B1 * | 10/2016 | Chun .................... G11C 29/023 |

(Continued)

*Primary Examiner* — Vanthu T Nguyen
(74) *Attorney, Agent, or Firm* — F. Chau & Associates, LLC

(57) ABSTRACT

A memory apparatus includes a memory cell array including a plurality of memory cells, a temperature sensor, a temperature compensated self refresh (TCSR) block, and a command controller. The temperature sensor is configured to generate temperature information by measuring internal temperature of the memory apparatus. The TCSR block is configured to vary and output, in a test mode of the memory apparatus, period information for adjusting a refresh period for the memory cell array according to the temperature information. The command controller is configured to adjust, in response to the period information, the refresh period for the memory cell array by controlling an external command.

9 Claims, 14 Drawing Sheets

(56) References Cited

U.S. PATENT DOCUMENTS

| | | | |
|---|---|---|---|
| 2005/0169083 A1* | 8/2005 | Riho | G06F 11/1004 365/222 |
| 2006/0083094 A1* | 4/2006 | Sinha | G11C 11/406 365/222 |
| 2015/0204941 A1* | 7/2015 | Schneider | G01R 31/2855 702/117 |
| 2017/0287548 A1* | 10/2017 | Ishikawa | G11C 11/40615 |

* cited by examiner

MEMORY APPARATUS INCLUDING A COMMAND CONTROLLER

CROSS-REFERENCE TO RELATED APPLICATION

This application claims priority under 35 U.S.C. § 119 to Korean Patent Application No. 10-2016-0116571, filed on Sep. 9, 2016 in the Korean Intellectual Property Office, the disclosure of which is incorporated by reference herein in its entirety.

TECHNICAL FIELD

Exemplary embodiments of the inventive concept relate to a memory apparatus, and more particularly, to a memory apparatus including a command controller.

DISCUSSION OF RELATED ART

Volatile memory apparatuses, such as dynamic random access memory (DRAM), perform refresh operations to retain stored data. As processes become minute, cell capacitance decreases, and the refresh level may need to be higher.

For a refresh test of a memory device, a type of test apparatus may include a test handler that tests a plurality of memory devices at a time in an environment with a temperature that is higher than room temperature (e.g., a thermal stress condition).

The plurality of memory devices to be tested, which are disposed on a tray, are accommodated in a chamber of the test handler. In this regard, the temperature in the chamber exhibits dispersion, and thus, the test temperature provided by the test apparatus and the temperature of each of the plurality of memory devices to be actually tested may be different, which may lead to degrading yield and quality of the plurality of memory devices.

SUMMARY

According to an exemplary embodiment of the inventive concept, a memory apparatus includes a memory cell array including a plurality of memory cells, a temperature sensor, a temperature compensated self refresh (TCSR) block, and a command controller. The temperature sensor is configured to generate temperature information by measuring internal temperature of the memory apparatus. The TCSR block is configured to vary and output, in a test mode of the memory apparatus, period information for adjusting a refresh period for the memory cell array according to the temperature information. The command controller is configured to adjust, in response to the period information, the refresh period for the memory cell array by controlling an external command.

According to an exemplary embodiment of the inventive concept, a memory apparatus includes a memory cell array including a plurality of memory cells, a period information generator, and a refresh controller. The period information generator is configured to output period information according to a temperature of the memory apparatus in a test mode. The refresh controller is configured to control, in the test mode, whether to perform a refresh of the memory cell array by blocking an external command or substituting the external command with a first internal signal, according to the period information.

According to an exemplary embodiment of the inventive concept, in a method of operating a test mode of a memory apparatus including a memory cell array, the method includes performing a data write operation on a first memory cell of the memory cell array, outputting a clock signal according to temperature information of the memory apparatus, counting a number of cycles of the clock signal to output a count value, determining whether the count value is greater than a predetermined value, outputting period information including a first period and a second period within one cycle, and performing a refresh operation during the second period. The first period is when the count value is less than or equal to the predetermined value and the second period is when the count value is greater than the predetermined value, and the first period occurs before the second period.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
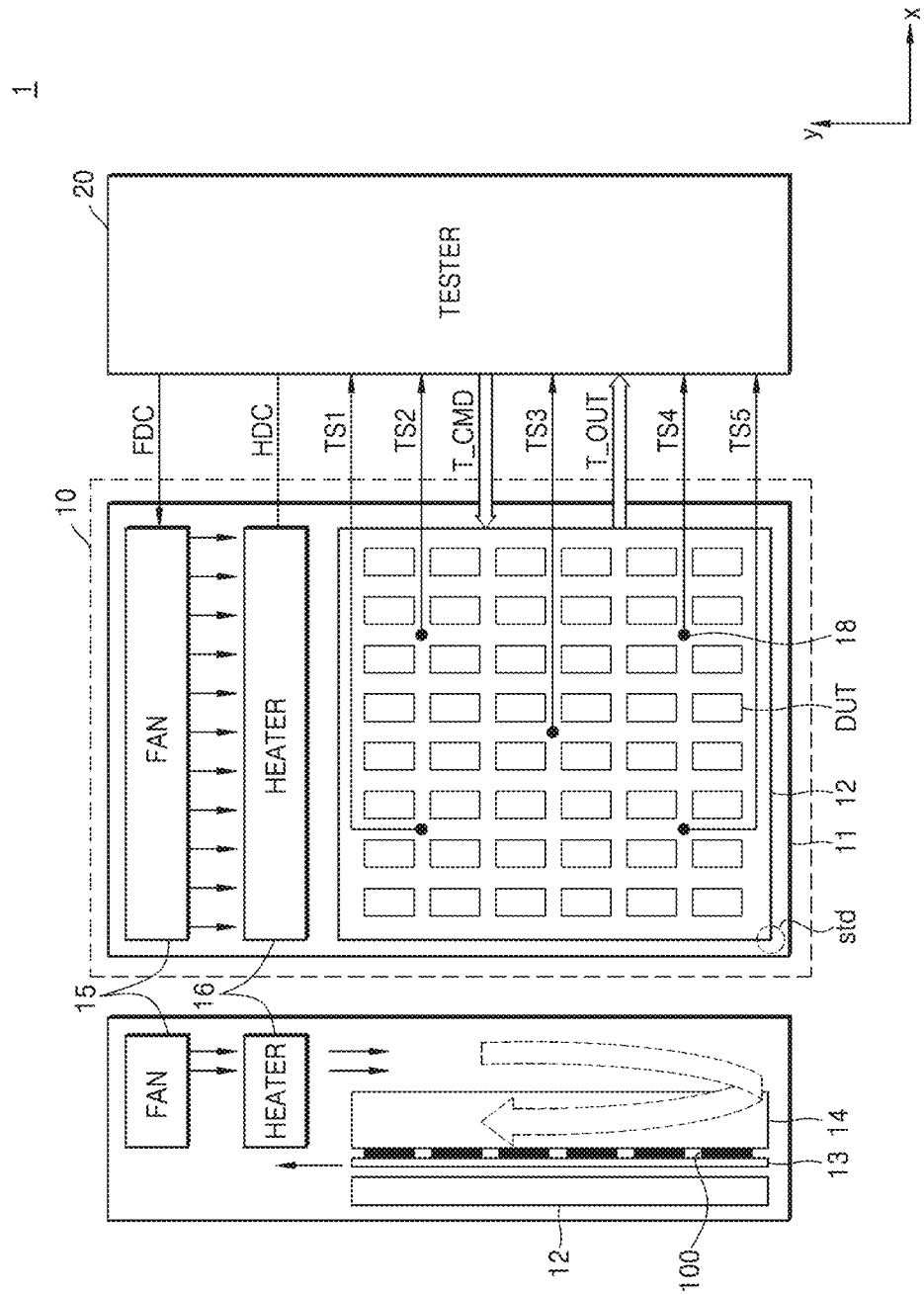
FIG. 1 is a diagram illustrating a test equipment for testing a memory apparatus, according to an exemplary embodiment of the inventive concept.

Exemplary embodiments of the inventive concept will be described more fully hereinafter with reference to the accompanying drawings. Like reference numerals may refer to like elements throughout this application.

Exemplary embodiments of the inventive concept provide a memory apparatus including a command controller configured to reflect a temperature of an actual memory device in a test.

FIG. 1 is a diagram illustrating a test equipment for testing a memory apparatus according to an exemplary embodiment of the inventive concept. A test equipment 1, for example, may test the refresh performance of the memory apparatus.

Referring to FIG. 1, the test equipment 1 may include a test handler 10 and a tester 20. The test handler 10 may include a loading chamber, a test chamber, and an unloading chamber. For example, the test chamber may be a test chamber 11. Memory devices DUT may be targeted for measurement. For example, every 256 or 512 memory devices DUT may be accommodated in a tray 13 and loaded into the loading chamber, carried to the test chamber, tested in the test chamber, and then unloaded into the unloading chamber. Although FIG. 1 illustrates 48 memory devices DUT targeted for measurement for convenience of description, the inventive concept is not limited thereto.

A test board 12 may be provided in the test chamber 11, and a match plate 14 may be disposed above the test board 12. The tray 13 may be positioned between the test board 12 and the match plate 14, and the memory devices DUT targeted for measurement that are accommodated in the tray 13 may be vacuum-adsorbed onto the match plate 14 and mounted into sockets of the test board 12. The test board 12 may include, for example, 256 or 512 sockets on a HiFix board, and may be electrically connected to the tester 20. Accordingly, the memory devices DUT targeted for measurement may be electrically connected to the tester 20 via the sockets and the HiFix board. A heater 16 may be provided at a rear or upper side of (e.g., in a y direction) the test board 12, and a fan 15 may be provided behind the heater 16. The tester 20 may provide a fan driving signal FDC and a heater driving signal HDC to the fan 15 and the heater 16, respectively. Temperature sensors 18 may be provided on the match plate 14 at the center and at four locations diagonally disposed from the center to measure temperatures TS1-TS5 in the test chamber 11.

The test chamber 11 may be filled with nitrogen gas, and then, internal air of the test chamber 11 may be heated and circulated by using the heater 16, the fan 15, and the temperature sensors 18 to heat at least one of the memory devices DUT, which includes a memory system 100 (described below with reference to FIG. 3), targeted for measurement, to a standard temperature.

The tester 20 may provide a test command T_CMD to the test board 12 for controlling the test board 12, and may receive a test output T_OUT from the test board 12.

In a temperature control system as described above, a relatively small number of temperature sensors 18, which are fewer than the memory devices DUT targeted for measurement, may be disposed to measure a internal space temperature of a chamber. Thus, accurate temperature measurement may be difficult, and temperature deviation of the memory devices DUT targeted for measurement may be difficult to avoid. Additionally, test handlers generally perform temperature offset adjustment infrequently, e.g., only once a year, and accordingly, adjustment responses may be made late, and thus, yield and quality problems may arise.

Figure 2B:
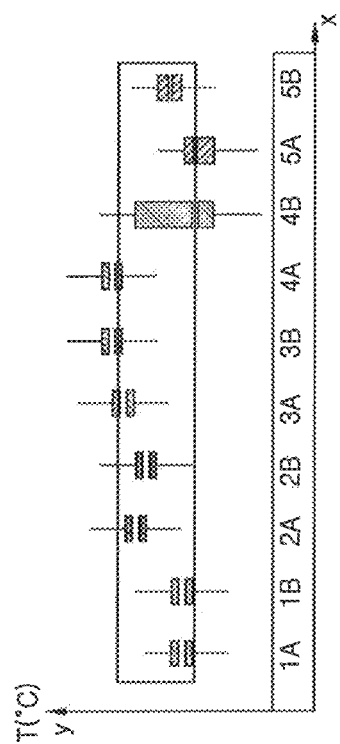
FIGS. 2A and 2B are a graph showing temperature dispersion in a test board of FIG. 1 and a graph showing temperature dispersion for a plurality of test equipment, respectively, according to an exemplary embodiment of the inventive concept.
Figure 2A:
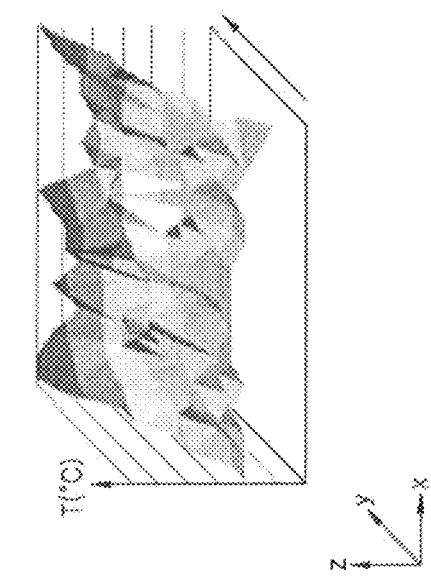

FIGS. 2A and 2B are a graph showing temperature dispersion in a test board of FIG. 1 and a graph showing temperature dispersion for a plurality of test equipment, respectively, according to an exemplary embodiment of the inventive concept.

As described with reference to FIG. 1, temperatures may disperse widely over different locations in the test board 12. In FIG. 2A, the z-axis denotes temperature, and the x-axis and the y-axis denote distances in the x-axis and y-axis directions, respectively, from a standard point std of the test board 12 of FIG. 1.

In FIG. 2A, temperature increases in the arrow direction of the z-axis. Temperature dispersion may be due to, for example, a distance from the heater 16 of FIG. 1. The distance from the heater 16 may decrease in the arrow direction of the y-axis. Accordingly, as illustrated in FIG. 2A, the closer to the heater 16, the higher the temperature, and the farther from the heater 16, the lower the temperature.

FIG. 2B shows temperature dispersion according to a plurality of test equipment, such as the test equipment 1 of FIG. 1. In detail, the y-axis denotes temperature, and numbers and letters on the x-axis (e.g., 1A to 5B) represent test equipment and test chambers, respectively. For example, reference numerals 1A and 1B may denote one test equipment (e.g., the test equipment 1) and different test chambers therein (e.g., the test chamber 11 and another test chamber).

Referring to FIG. 2B, each test equipment may have temperature dispersion, and furthermore, in the same test equipment, dispersion may arise between different test chambers. As described above, this may be a result of a delay in the temperature offset adjustment response.

Accordingly, exemplary embodiments of the inventive concept may provide a memory apparatus where actual temperatures of memory devices (e.g., including the memory system 100) targeted for measurement are reflected in a refresh test, rather than a temperature provided by a test apparatus. Thus, yield and quality of the memory apparatus may increase.

Figure 3:
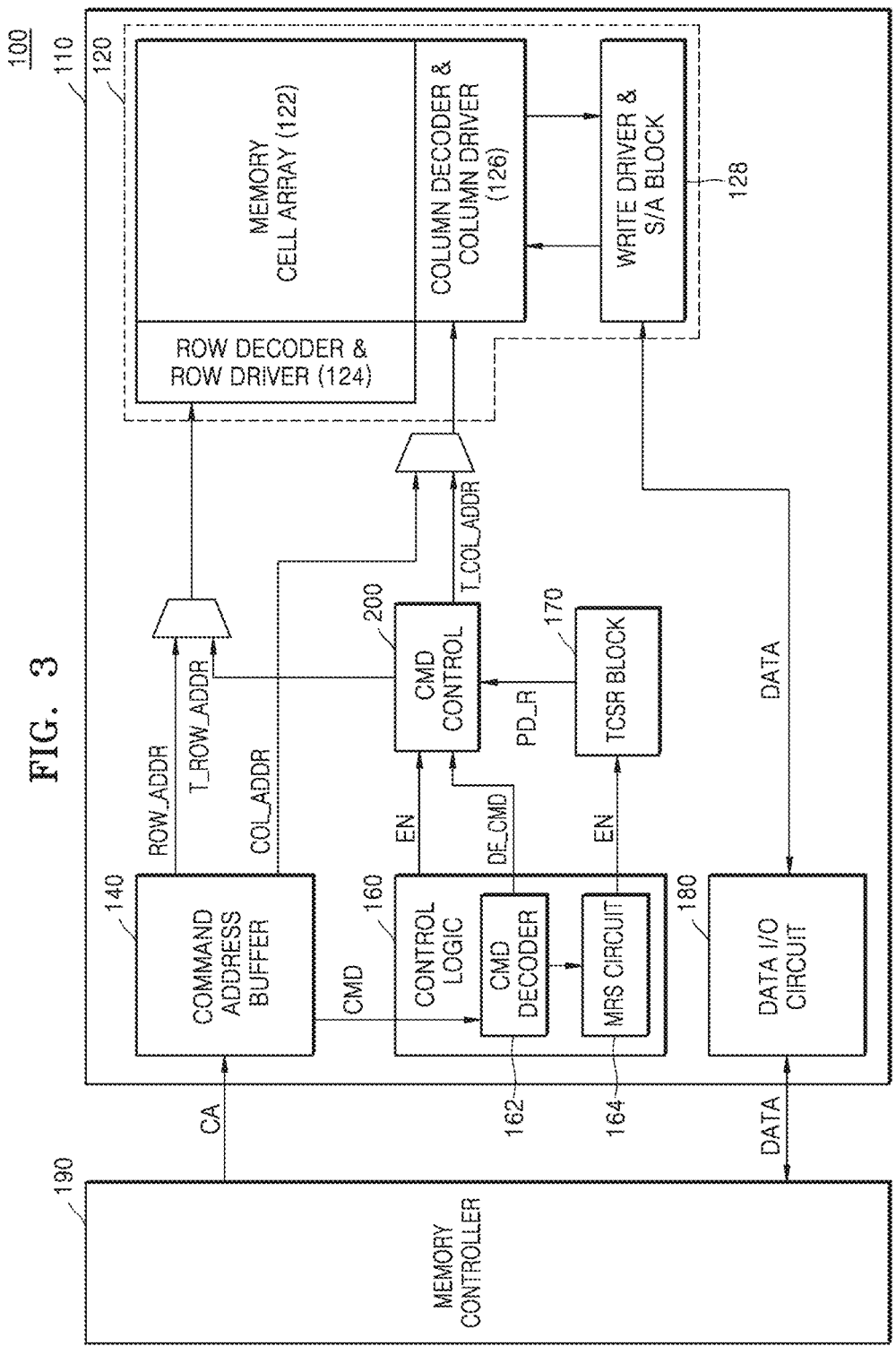
FIG. 3 is a block diagram of a memory system including a memory apparatus, according to an exemplary embodiment of the inventive concept.

FIG. 3 is a block diagram of a memory system including a memory apparatus according to an exemplary embodiment of the inventive concept.

Referring to FIG. 3, the memory system 100 may include a memory apparatus 110 and a memory controller 190. As described above, the memory system 100 may be, for example, a system included in each of the memory devices DUT of FIG. 1 targeted for measurement.

The memory apparatus 110 may include a command address buffer 140, a control logic 160, a data storing unit 120, a data input/output (I/O) circuit 180, a temperature compensated self refresh (TCSR) block 170, and a command (CMD) controller 200.

The command address buffer 140 may receive a command-address CA from outside of the memory apparatus 110, for example, from the memory controller 190, and may temporarily store information regarding the command-address CA. The command-address CA may support or include either or both of command information and address information. In an exemplary embodiment of the inventive concept, the memory apparatus 110 may include a command buffer and an address buffer that are separate from one another, rather than the command address buffer 140.

The command-address CA input to the command address buffer 140 may include address information ADDR and/or a command CMD.

The address information ADDR included in the command-address CA may be information regarding an address designating at least one of a plurality of memory cells of a memory cell array 122 included in the data storing unit 120. The address information ADDR may include row-address information ROW_ADDR and/or column-address information COL_ADDR. In exemplary embodiments of the inventive concept, the command address buffer 140 may include a latch capable of temporarily storing the address information ADDR. The command address buffer 140 may transmit the address information ADDR to the data storing unit 120 according to control by the control logic 160. In exemplary embodiments of the inventive concept, the address information ADDR stored in the latch included in the command address buffer 140 may be changed by the control logic 160.

The command CMD included in the command-address CA may be information that determines an operation of the memory apparatus 110. In exemplary embodiments of the inventive concept, the command address buffer 140 may include a latch capable of temporarily storing the command CMD. The command address buffer 140 may transmit the command CMD to the control logic 160.

The control logic 160 may control overall operations of the memory apparatus 110. The control logic 160 may include a command (CMD) decoder 162, a clock generator, and/or a mode register set (MRS) circuit 164.

The CMD decoder 162 may decode the command CMD received from the command address buffer 140 and internally generate a decoded command (DE_CMD) signal.

The clock generator included in the control logic 160 may generate a clock signal and supply the clock signal within the memory apparatus 110.

The MRS circuit 164 may respond to the command CMD for determining an operation mode of the memory apparatus 110 and/or the address information ADDR, and may set an internal mode register. For example, the operation mode may correspond to a read mode, a write mode, a test MRS mode, a vendor mode, a built in self test (BIST) mode, etc. The operation mode may be set and stored in a mode register, and the MRS circuit 164 may include a plurality of mode registers and may be easily used in a circuit test. The mode register may be implemented separately from the memory cell array 122, which will be described below. Alternatively, the mode register may be implemented as a part of the memory cell array 122.

The operation mode of the memory apparatus 110 may be classified into a test mode and a non-test mode. For example, the MRS circuit 164 may respond to a test MRS command or a BIST command and be set as the test mode. When the MRS circuit 164 operates in the test mode, the MRS circuit 164 may output an enable signal EN to the CMD controller 200 and/or the TCSR block 170. Hereinafter, a case where the memory apparatus 110 operates in the test mode will be described.

The data storing unit 120 may include the memory cell array 122, a row decoder & row driver 124, a column decoder & column driver 126, and a write driver & sense amplifier (S/A) block 128.

The memory cell array 122 includes word lines, bit lines, and memory cells connected to the word lines and bit lines. The memory cells may store at least 1 bit of data. Although the memory cells may be implemented as volatile memory capable of storing data when power is supplied, the inventive concept is not limited thereto. For example, the memory cells may be dynamic random access memory (DRAM), synchronous DRAM (SDRAM), double data rate SDRAM (DDR SDRAM), low power double data rate SDRAM (LPDDR SDRAM), graphics double data rate SDRAM (GDDR SDRAM), DDR2 SDRAM, DDR3 SDRAM, DDR4 SDRAM, etc.

The row decoder & row driver 124 may perform an operation of selecting one of the word lines based on the row-address information ROW_ADDR output from the command address buffer 140 or test-row-address information T_ROW_ADDR output from the CMD controller 200, which will be described below, and an operation of driving the selected word line with a necessary operation voltage.

The column decoder & column driver 126 may control, based on the column-address information COL_ADDR output from the command address buffer 140 or test-column-address information T_COLUMN_ADDR output from the CMD controller 200, which will be described below, a connection between each of the bit lines and the write driver & S/A block 128.

For example, when the address information ADDR stored in the command address buffer 140 designates a memory cell corresponding to a first address, the row decoder & row driver 124 may select, from among the word lines, a first word line, and the column decoder & column driver 126 may connect, from among the bit lines, a first bit line to the write driver & S/A block 128. The first word line is a word line to which the memory cell corresponding to the first address is connected. The first bit line is a bit line to which the memory cell corresponding to the first address is connected.

The write driver & S/A block 128 may generate an electric signal corresponding to write data DATA received from the data I/O circuit 180, may sense-amplify an electric signal output from at least one bit line connected to the column decoder & column driver 126 and generate read data corresponding to the sense-amplified electric signal, and may transmit the read data to the data I/O circuit 180.

The data I/O circuit 180 may include a data input circuit and a data output circuit connected to a data input/output terminal.

The data I/O circuit 180 may receive write data DATA from and transmit read data DATA to the memory controller 190.

According to a control of the control logic 160, the data input circuit receives write data DATA that is input from the data input/output terminal during an operation of writing data and transmits the write data DATA to the data storing unit 120.

According to a control of the control logic 160, the data output circuit outputs read data DATA that is transmitted from the data storing unit 120 during an operation of reading data to the outside, e.g., the memory controller 190, via the data input/output terminal.

The TCSR block 170 may output, in the test mode, period information PD_R according to information regarding the internal temperature of the memory apparatus 110. The period information PD_R may be used to adjust a refresh period for the memory cell array 122. The period information PD_R may vary according to the internal temperature of the memory apparatus 110. The TCSR block 170 will be described below in detail with reference to FIG. 4.

The CMD controller 200 may receive, in the test mode, the decoded command DE_CMD decoded by the CMD decoder 162 and/or the period information PD_R output from the TCSR block 170 according to the temperature of the memory apparatus 110. In response to the period information PD_R, the CMD controller 200 may control the decoded command DE_CMD. The CMD controller 200 may adjust the refresh period for the memory cell array 122 by controlling the decoded command DE_CMD. The CMD controller 200 will be described below in detail with reference to FIG. 5.

Figure 4:
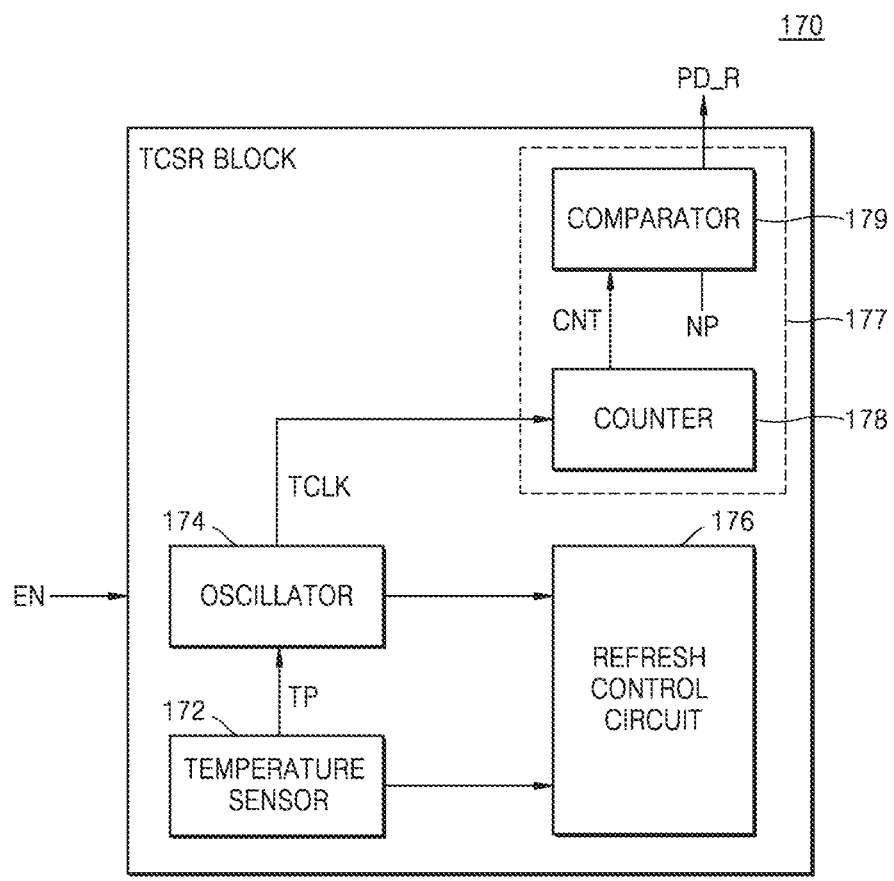
FIG. 4 is a block diagram of a temperature compensated self refresh (TCSR) block of FIG. 3 according to an exemplary embodiment of the inventive concept.

FIG. 4 is a block diagram of a TCSR block of FIG. 3 according to an exemplary embodiment of the inventive concept.

Referring to FIGS. 3 and 4, the TCSR block 170 may include a temperature sensor 172, an oscillator 174, a refresh control circuit 176, and an output unit 177.

The temperature sensor 172 may measure the temperature of the memory apparatus 110 and may provide the measured temperature to the oscillator 174 and the refresh control circuit 176 as temperature information TP. In exemplary embodiments of the inventive concept, the temperature sensor 172 may not be disposed in the TCSR block 170; rather, it may be disposed in another circuit region of the memory apparatus 110. In exemplary embodiments of the inventive concept, the temperature of the memory apparatus 110 may be provided from an external apparatus.

The oscillator 174 may generate a clock signal TCLK according to the temperature information TP provided from the temperature sensor 172. In the present exemplary embodiment, the oscillator 174 may generate the clock signal TCLK having a cycle that varies according to the provided temperature information TP. The clock signal TCLK may have a cycle that shortens as the internal temperature of the memory apparatus 110, measured by the temperature sensor 172 increases, and lengthens as the internal temperature of the memory apparatus 110 decreases. In the test mode, the clock signal TCLK may be provided to the output unit 177 to generate the period information PD_R for adjusting the refresh period for the memory cell array 122. In the test mode and/or the non-test mode, a clock signal may be provided to the refresh control circuit 176 to control a refresh cycle.

The output unit 177 may receive the clock signal TCLK provided from the oscillator 174 and output the period information PD_R for adjusting the refresh period for the memory cell array 122. In the present exemplary embodiment, the output unit 177 may include a counter 178 and a comparator 179.

The counter 178 may receive the clock signal TCLK and perform an operation of counting the clock signal TCLK, and may output a count signal CNT to the comparator 179. For example, the counter 178 may count the number of cycles of the clock signal TCLK and output a count result as the count signal CNT. In the present exemplary embodiment, counting the number of cycles of the clock signal TCLK may be performed by counting a number of rising edges and/or falling edges of the clock signal TCLK.

The comparator 179 may compare the count signal CNT, output from the counter 178, and a set number of times NP with each other. The set number of times NP may be, for example, set differently by the MRS circuit 164. The set number of times NP may be input to the comparator 179 as a plurality of corresponding bits. Thus, the comparator 179 may compare the count signal CNT and the set number of times NP with each other and output the period information PD_R differently according to a comparison result, which will be further described below.

Figure 5:
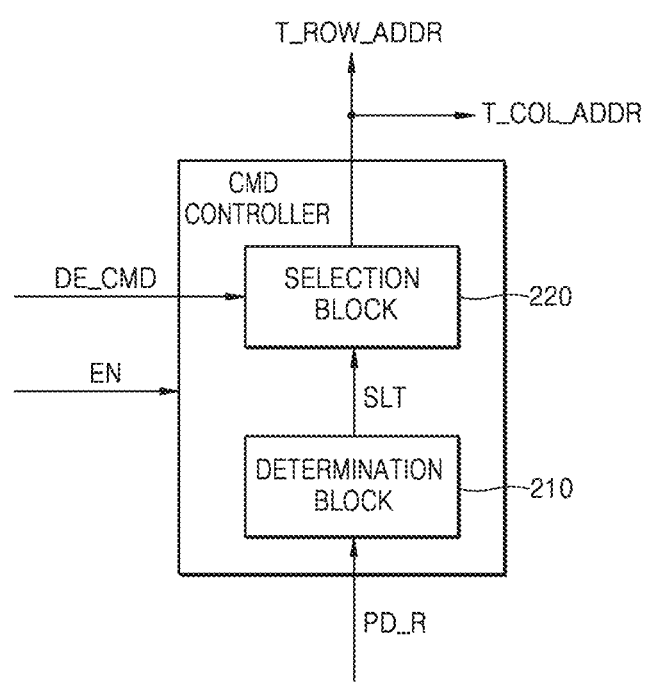
FIG. 5 is a block diagram of a command controller of FIG. 3 according to an exemplary embodiment of the inventive concept.

FIG. 5 is a block diagram of a CMD controller of FIG. 3 according to an exemplary embodiment of the inventive concept.

Referring to FIGS. 3 and 5, the CMD controller 200 may include a determination block 210 and a selection block 220.

The determination block 210 may receive the period information PD_R output from the TCSR block 170, and thus, may divide the period information PD_R into a plurality of periods and make a determination. The determination block 210 may output a selection control signal SLT to the selection block 220 so that a control operation for the decoded command DE_CMD may be performed according to the period information PD_R.

In the present exemplary embodiment, the period information PD_R may include a first period PD_R1 having a first logic state and a second period PD_R2 having a second logic state, which will be described below with reference to FIG. 8. A cycle of the period information PD_R may be substantially the same regardless of the actual temperature of the memory apparatus 110. Within one cycle, the longer the first period PD_R1, the shorter the second period PD_R2. The length of the first period PD_R1 and/or the second period PD_R2 may be adjusted according to the temperature.

The selection block 220 may receive the decoded command DE_CMD provided from the CMD decoder 162 and the selection control signal SLT output from the determination block 210, and may control the decoded command DE_CMD. By the control of the selection block 220, a refresh period for the memory cell array 122 may be adjusted. In the present exemplary embodiment, when the period information PD_R includes the first period PD_R1 and the second period PD_R2, control of the selection block 220 regarding the same decoded command DE_CMD may vary accordingly. For example, a refresh for the memory cell array 122 may not be performed during the first period PD_R1, and a refresh for the memory cell array 122 may be performed during the second period PD_R2.

Figure 6:
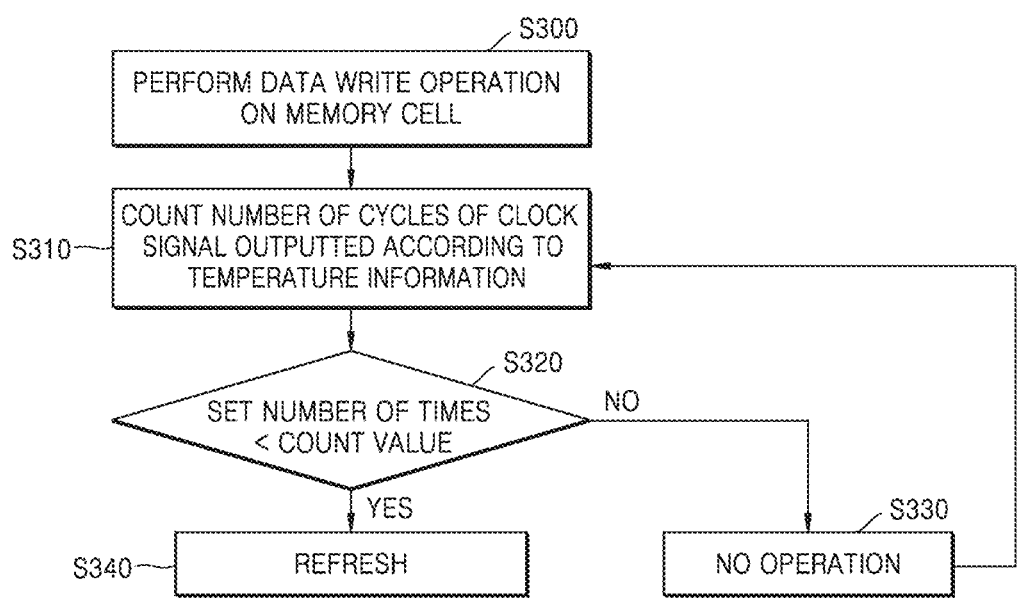
FIG. 6 is a flowchart illustrating operations in a test mode of the memory apparatus of FIG. 3 according to an exemplary embodiment of the inventive concept.

FIG. 6 is a flowchart illustrating operations in a test mode of the memory apparatus of FIG. 3 according to an exemplary embodiment of the inventive concept. FIG. 6 may relate to, for example, a first test mode of the memory apparatus 110. In the first test mode, after all operations are paused for a certain time period with respect to a memory cell on which a data write operation has been performed, data may be read, and thus, a limit value of a refresh cycle may be tested.

Referring to FIG. 6, in operation S300, a data write operation may be performed on at least one of the memory cells included in the memory cell array 122 of FIG. 3. The data write operation may be performed based on the address information ADDR output from the command address buffer 140. For example, one of the word lines may be selected based on the row-address information ROW_ADDR from among pieces of the address information ADDR, and one of the bit lines may be selected based on the column-address information COL_ADDR.

After the data write operation is performed, in operation S310, the number of cycles of the clock signal TCLK, which is output according to the temperature information TP, may be counted. In the present exemplary embodiment, the temperature information TP may be the internal temperature of the memory apparatus 110, sensed by the temperature sensor 172 in the TCSR block 170. Alternatively, the temperature sensor 172 may instead be disposed in another circuit region of the memory apparatus 110.

As described above, the clock signal TCLK may be output from the oscillator 174 in the TCSR block 170 according to the temperature information TP output from the temperature sensor 172. In the present exemplary embodiment, the clock signal TCLK may have a cycle that varies according to the temperature information TP. The cycle of the clock signal TCLK may shorten as the internal temperature of the memory apparatus 110 increases and may lengthen as the internal temperature of the memory apparatus 110 decreases.

Counting the number of cycles of the clock signal TCLK may be performed, for example, by the counter 178. In the present exemplary embodiment, the clock signal TCLK may be input to the counter 178 in the TCSR block 170. The counter 178 may receive the clock signal TCLK provided from the oscillator 174, perform an operation of counting the number of cycles of the clock signal TCLK, and output the count result or value as the count signal CNT. In other words, the counter 178 may count the cycles of the clock signal TCLK and output the count value as the count signal CNT.

In operation S320, the number of cycles of the clock signal TCLK (e.g., the count value) may be compared with the set number of times NP. The set number of times NP is a previously determined value from counting the number of cycles of the clock signal TCLK and may be changed. The set number of times NP may be set by taking into account a limit value of a refresh cycle to be tested.

In the present exemplary embodiment, comparing the set number of times NP with the count value may be performed by the comparator 179 in the TCSR block 170. The comparator 179 may receive the count value via the count signal CNT output from the counter 178. The comparator 179 may output the period information PD_R by performing a comparing operation.

After the period information PD_R is output, different operations may be performed on the memory cell array 122 according to the logic state of the period information PD_R. In the present exemplary embodiment, the period information PD_R may include the first period PD_R1 having the first logic state and the second period PD_R2 having the second logic state. The period information PD_R of the first period PD_R1 may be output earlier than the period information PD_R of the second period PD_R2.

The period information PD_R of the first period PD_R1 may be output when the count value included in the count signal CNT is less than or equal to the set number of times NP. In operation S330, during the first period PD_R1 when the count value is less than or equal to the set number of times NP, no operation may be performed on the memory cell on which data has been written.

In the present exemplary embodiment, no operation may be performed by blocking, in the CMD controller 200, the decoded command DE_CMD according to the period information PD_R.

For example, the period information PD_R, output by comparing the set number of times NP and the count value, may be input to the determination block 210 included in the CMD controller 200. The determination block 210 may determine that the input period information PD_R is the period information PD_R of the first period PD_R1, and thus, may output the selection control signal SLT to the selection block 220 so that a control operation for the decoded command DE_CMD may be performed.

The selection block 220 may receive the decoded command DE_CMD output from the CMD decoder 162 and the selection control signal SLT output from the determination block 210, and may perform the control operation for the decoded command DE_CMD. When the selection control signal SLT corresponds to the period information PD_R of the first period PD_R1, the selection block 220 may block the input decoded command DE_CMD. In the present exemplary embodiment, the input decoded command DE_CMD may be a refresh command. By blocking the decoded command DE_CMD while the selection control signal SLT is input to the selection block 220, no operation including a refresh may be performed on the memory cell on which the data write operation has been performed.

The period information PD_R of the second period PD_R2 may be output when the count value is greater than the set number of times NP. In operation S340, during the second period PD_R2 when the count value is greater than the set number of times NP, a refresh operation may be performed on the memory cell array 122.

In the present exemplary embodiment, the refresh operation for the memory cell array 122 may be performed as the above-described blocking operation is paused. For example, as the count value becomes greater than the set number of times NP, the period information PD_R of the second period PD_R2 may be output from the comparator 179, and the determination block 210 may receive it. The determination block 210 may determine that the input period information PD_R is the period information PD_R of the second period PD_R2, and thus, may output the selection control signal SLT to the selection block 220 so that a control operation for the decoded command DE_CMD may be performed.

Before the selection control signal SLT according to the period information PD_R of the second period PD_R2 is input to the selection block 220, the selection block 220 may have been performing the blocking operation. As the selection control signal SLT is input to the selection block 220, the selection block 220 may terminate the blocking operation for the decoded command DE_CMD. Thus, an operation corresponding to the decoded command DE_CMD may be performed in the memory cell array 122. The decoded command DE_CMD may be the refresh command.

In the present exemplary embodiment, the refresh may be a CAS-Before-RAS (CBR) refresh. The CBR refresh refers to a scheme where, instead of externally inputting a row address, a refresh row address is generated in a refresh counter in the memory apparatus 110 whenever a refresh is required. In the CBR refresh operation, when the refresh counter is initialized to reset a CBR refresh row address to "0", a memory cell row corresponding to the CBR refresh row address is refreshed. The memory cell row refers to a row of memory cells connected to one word line. For convenience of description, a minimum or first memory cell row corresponding to the CBR refresh row address is referred to as "WL0", and a second memory cell row corresponding to the CBR refresh row address that is increased by as much as "1" by the refresh counter is referred to as "WL1". During a refresh cycle, the CBR refresh operation sequentially refreshes memory cell rows WL0, WL1, . . . , WLn−1, WLn, . . . and finally refreshes a maximum or last memory cell row.

Figure 7:
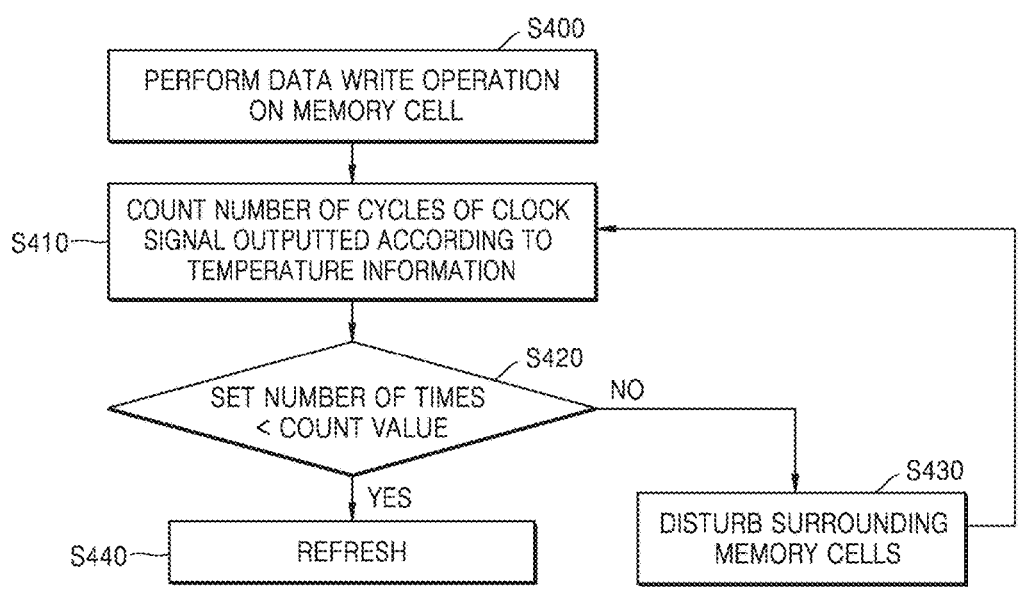
FIG. 7 is a flowchart illustrating operations in a test mode of the memory apparatus of FIG. 3 according to an exemplary embodiment of the inventive concept.

FIG. 7 is a flowchart illustrating operations in a test mode of the memory apparatus of FIG. 3 according to an exemplary embodiment of the inventive concept. FIG. 7 may relate to, for example, a second test mode of the memory apparatus 110. In the second test mode, after surrounding cells of a memory cell on which a data write operation has been performed are disturbed for a certain time period, data may be read, and thus, a limit value of a refresh cycle may be tested.

Repeat description of operations of illustrated in FIG. 7 that have been already described with reference to FIG. 6 will be omitted.

Referring to FIG. 7, in operation S400, a data write operation may be performed on at least one of the memory cells included in the memory cell array 122, and in operation S410, the number of cycles of the clock signal TCLK output according to the temperature information TP may be counted to obtain the count value (e.g., the count signal CNT). In operation S420, the count value may be compared with the set number of times NP that was previously determined. In the present exemplary embodiment, comparison of the count value and the set number of times NP may be performed by the comparator 179 in the TCSR block 170, and the comparator 179 may output the period information PD_R corresponding thereto.

Different operations may be performed on the memory cell array 122 according to the period information PD_R. In the present exemplary embodiment, the period information PD_R may include the first period PD_R1 having the first logic state and the second period PD_R2 having the second logic state. The period information PD_R of the first period PD_R1 may be output earlier than the period information PD_R of the second period PD_R2.

The period information PD_R of the first period PD_R1 may be output when the count value is less than or equal to the set number of times NP. In operation S430, during the first period PD_R1 when the count value is less than or equal to the set number of times NP, a disturb operation may be performed on surrounding memory cells located around (e.g., adjacent to) the memory cell on which data has been written. The disturb operation may be performed, for example, by causing the surrounding cells to be in an active state. The active state may be reached by applying a certain voltage to a word line and a bit line of these cells.

In the present exemplary embodiment, the disturb operation may be performed by controlling, with the CMD controller 200, an operation corresponding to the decoded command DE_CMD according to the period information PD_R. For example, the period information PD_R output via the comparator 179 may be input to the determination block 210 included in the CMD controller 200, and the determination block 210 may determine that the input period information PD_R is the period information PD_R of the first period PD_R1, and thus, may output the selection control signal SLT to the selection block 220 so that a control operation for the decoded command DE_CMD may be performed.

The selection block 220 may receive the decoded command DE_CMD output from the CMD decoder 162 and the selection control signal SLT output from the determination block 210, and may perform the control operation for the decoded command DE_CMD. When the selection control signal SLT corresponds to the period information PD_R of the first period PD_R1, the selection block 220 may control an operation corresponding to the decoded command DE_CMD. In the present exemplary embodiment, the decoded command DE_CMD may be an active command. According to the active command, the disturb operation may be performed on the surrounding cells located around the memory cell on which data has been written, while the selection control signal SLT is input.

The period information PD_R of the second period PD_R2 may be output when the count value is greater than the set number of times NP. In operation S440, during the second period PD_R2 when the count value is greater than the set number of times NP, the refresh operation may be performed.

In the present exemplary embodiment, the refresh operation for the memory cell array 122 may be performed by substituting the decoded command DE_CMD with a first internal signal. For example, as the count value becomes greater than the set number of times NP, the period information PD_R of the second period PD_R2 may be output from the comparator 179, and the determination block 210 may receive it. The determination block 210 may determine that the input period information PD_R is the period information PD_R of the second period PD_R2, and thus, may output the selection control signal SLT to the selection block 220 so that a control operation for the decoded command DE_CMD may be performed.

Before the selection control signal SLT according to the period information PD_R of the second period PD_R2 is input to the selection block 220, the selection block 220 may have been controlling an operation corresponding to the decoded command DE_CMD. As the selection control signal SLT is input to the selection block 220, the selection block 220 may substitute the decoded command DE_CMD with the first internal signal. In the present exemplary embodiment, the decoded command DE_CMD may be the active command, and the first internal signal may be the refresh command. Thus, while the period information PD_R of the second period PD_R2 is input, the refresh operation may be performed with respect to the memory cell array 122. In the present exemplary embodiment, the refresh may be the CBR refresh.

Figure 8:
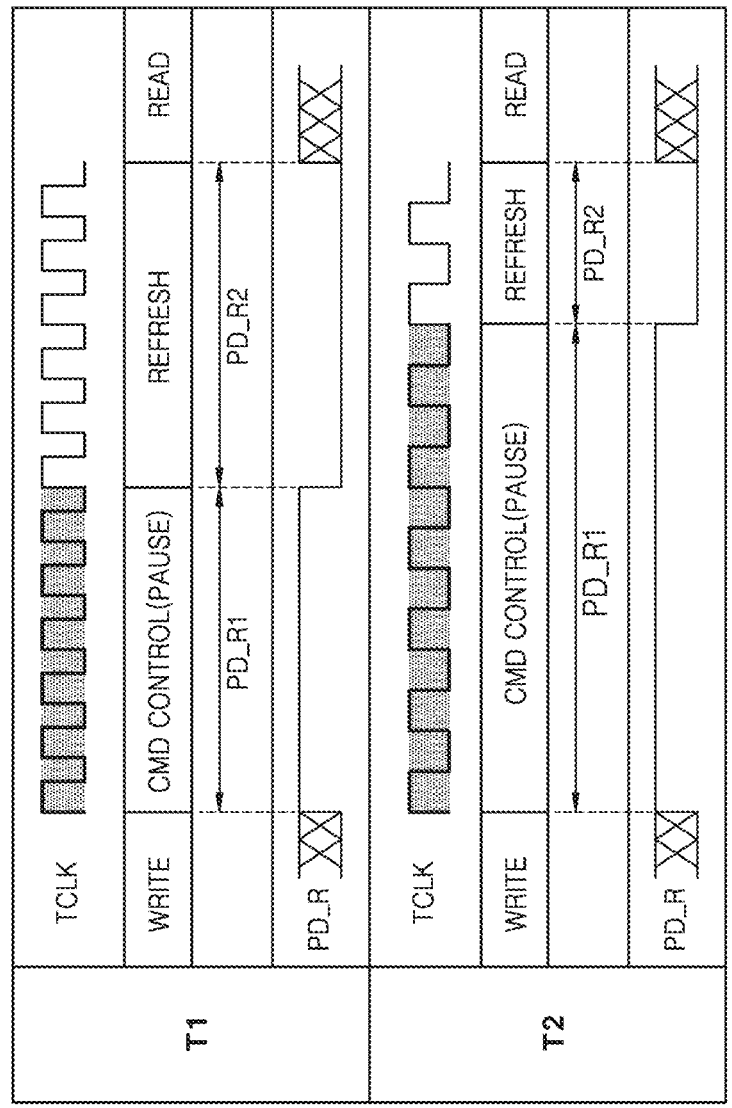
FIGS. 8 and 9 illustrate operations according to temperatures of the memory apparatus of FIG. 3 according to an exemplary embodiment of the inventive concept.
Figure 9:
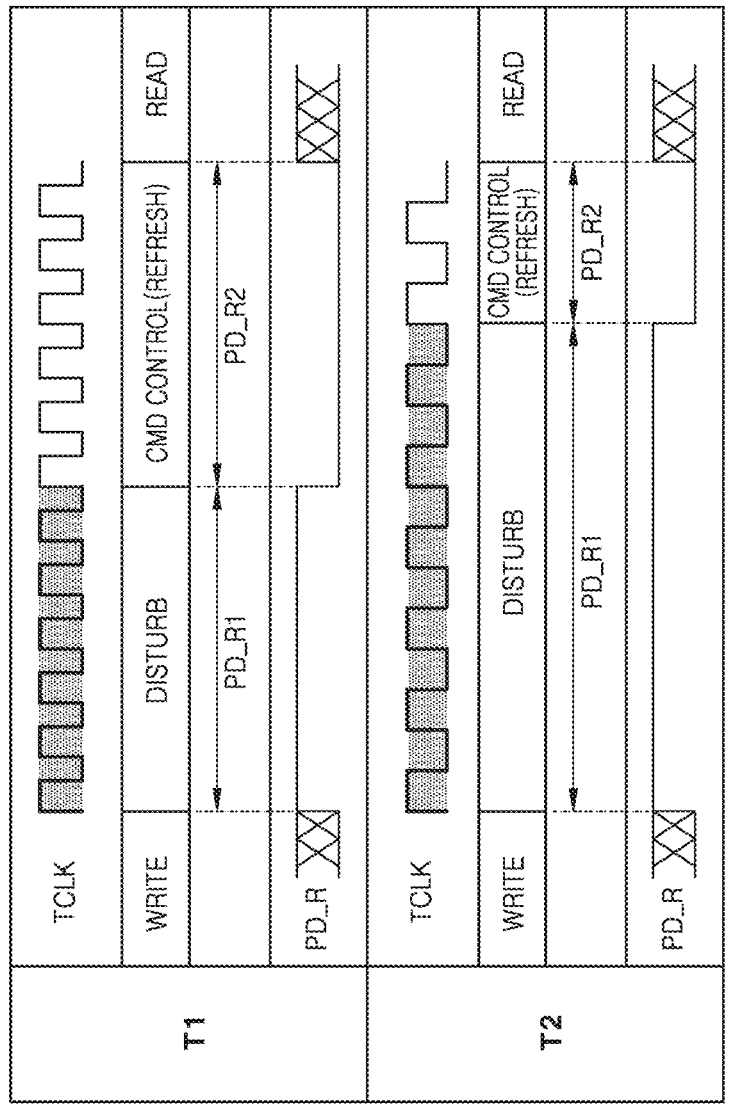

FIGS. 8 and 9 illustrate operations according to temperatures of the memory apparatus of FIG. 3, according to an exemplary embodiment of the inventive concept. T1 and T2 refer to a first temperature and a second temperature, respectively. The first temperature T1 may be higher than the second temperature T2. In the present exemplary embodiment, FIG. 8 may illustrate operations in the first test mode, and FIG. 9 may illustrate operations in the second test mode. For illustrative purposes, the set number of times NP may be equal to six in FIGS. 8 and 9.

Referring to FIG. 8, a data write operation may be performed on at least one memory cell, and then, a test operation may be performed. The test operation may be intended to measure a limit of a refresh cycle in the at least one memory cell. However, the inventive concept is not limited thereto.

After the data write operation is performed on the memory cell, the number of cycles of the clock signal TCLK, which may vary according to temperature, may be counted. The clock signal TCLK at the first temperature T1 may have a shorter cycle than the clock signal TCLK at the second temperature T2. The clock signal TCLK may be output from the oscillator 174 included in the TCSR block 170, as described with reference to FIG. 4.

The period information PD_R may be output according to a comparison of the number of cycles of the clock signal TCLK and the set number of times NP. The period information PD_R may include the first period PD_R1 having the first logic state and the second period PD_R2 having the second logic state. A cycle of the period information PD_R may be substantially the same regardless of the actual temperature of the memory apparatus. Within one cycle, the longer the first period PD_R1, the shorter the second period PD_R2. The length of the first period PD_R1 and/or the second period PD_R2 may be adjusted according to the temperature. As can be seen in FIG. 8, the first period PD_R1 for the first temperature T1 is shorter than the first period PD_R1 for the second temperature T2. Although FIG. 8 illustrates the first logic state of the first period PD_R1 as "High" and the second logic state of the second period PD_R2 as "Low", this is for convenience of description, and the inventive concept is not limited thereto.

The number of cycles of the clock signal TCLK may be counted to obtain the count value, and thus, during the first period PD_R1, which is before the count value is greater than the set number of times NP, an external command may be controlled. In the present exemplary embodiment, controlling the external command may be blocking the external command. By blocking the external command, no operation may be performed on the memory cell array 122 of FIG. 3 (PAUSE).

During the second period PD_R2 in which the count value is greater than the set number of times NP, a refresh operation may be performed on the memory cell array 122 of FIG. 3. In the present exemplary embodiment, the refresh operation may be performed as the blocking operation of the external command is terminated. After the refresh operation is completed, data written on the memory cell may be read, and thus, the limit of the refresh cycle may be measured.

Referring to FIG. 9, unlike FIG. 8, during the first period PD_R1, which is before the count value is greater than the set number of times NP, a disturb operation may be performed. The disturb operation may be performed with respect to surrounding cells of a memory cell on which a data write operation has been performed. In the present exemplary embodiment, the disturb operation may be an operation corresponding to an external command. The external command may be an active command.

During the second period PD_R2 in which the count value is greater than the set number of times NP, the refresh operation may be performed on the memory cell array 122 of FIG. 3. In the present exemplary embodiment, the refresh operation may be performed by substituting the external command with a first internal signal. The first internal signal may be a refresh command. After the refresh operation is completed, data written on the memory cell may be read, and thus, a limit of a refresh cycle may be measured.

Although FIGS. 8 and 9 illustrate the set number of times NP to distinguish between the first period PD_R1 and the second period PD_R2 as six, this is for convenience of description, and the inventive concept is not limited thereto.

Figure 10:
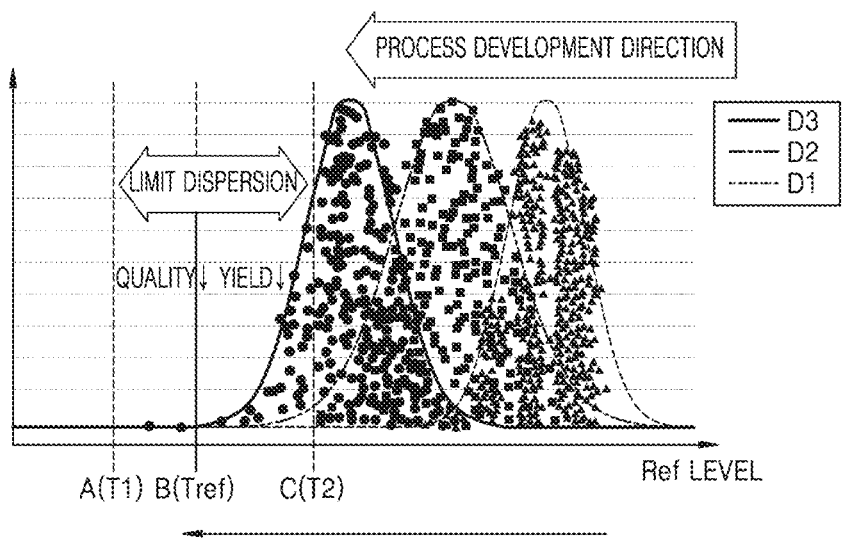
FIG. 10 is a graph showing a dispersion of refresh levels for memory apparatuses that are tested.

FIG. 10 is a graph showing a dispersion of refresh levels for memory apparatuses that are tested. The refresh level on the x-axis of the graph may denote a limit value of a refresh cycle and decreases from right to left as indicated by the arrow.

Referring to FIG. 10, the dispersion of the refresh levels changes from a D1 dispersion to a D3 dispersion in a process development direction. In other words, as processes develop, the refresh cycle shortens.

In a refresh cycle test, a refresh limit cycle of B may be tested at a test reference temperature Tref. In this regard, due to temperature dispersion influence of the test handler described above with reference to FIG. 1, actual temperature of the memory apparatus 110 that is tested may have a dispersion ranging from the first temperature T1 to the second temperature T2. Here, the first temperature T1 may be lower than the temperature Tref, and the second temperature T2 may be higher than the temperature Tref.

A plurality of memory apparatuses (e.g., the memory apparatus 110 of FIG. 3) may be tested. From among the memory apparatuses that are tested, the memory apparatuses having the temperature of T1 may actually have the limit cycle of B tested at the first temperature T1 rather than the test reference temperature Tref. When converted in terms of the test reference temperature Tref, the limit cycle of B at the first temperature T1 may be a limit cycle of A. Accordingly, as for the memory apparatuses having the first temperature T1, the limit cycle of A may be regarded as being tested at the test reference temperature Tref. In other words, regarding the memory apparatuses having a temperature in the range of T1 to Tref, there may be concern about quality degradation in spite of testing.

From among the memory apparatuses that are tested, the memory apparatuses having the temperature of T2 may actually have the limit cycle of B tested at the second temperature T2 rather than the test reference temperature Tref. When converted in terms of the test reference temperature Tref, the limit cycle of B at the second temperature T2 may be a limit cycle of C. Accordingly, as for the memory apparatuses having the second temperature T2, the limit cycle of C may be regarded as being tested at the test reference temperature Tref. In other words, regarding the memory apparatuses having a temperature in the range of Tref to T2, there may be concern about yield degradation caused by testing.

However, in a memory apparatus according to exemplary embodiments of the inventive concept, in a test mode, a refresh period for a memory cell array may be adjusted according to temperature information of the memory apparatus. Accordingly, a refresh limit cycle reflecting temperature of the memory apparatus may be measured, and thus, yield and quality of the memory apparatus may be increased.

Figure 11:
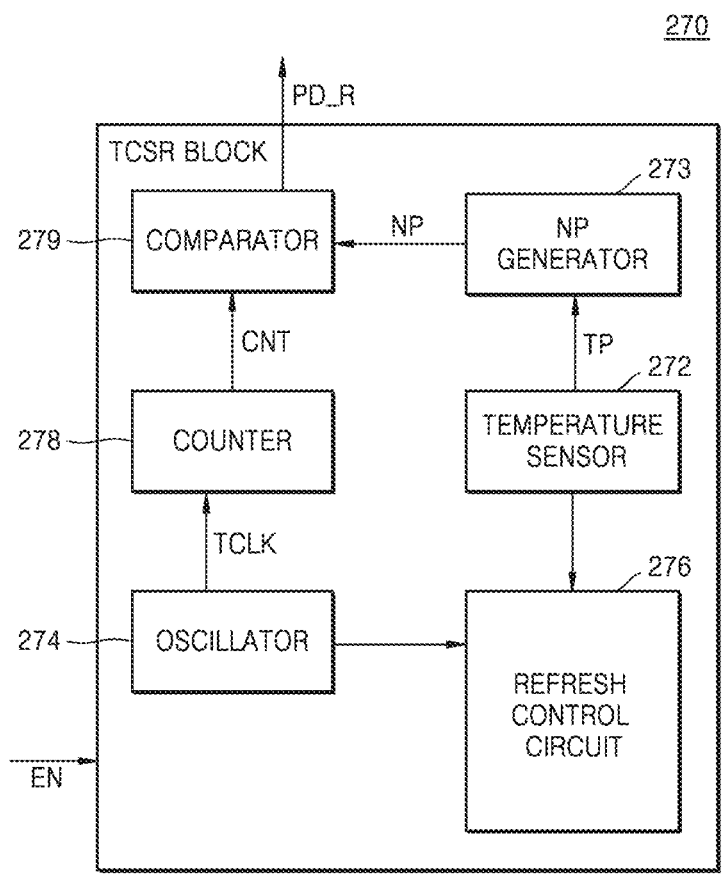
FIG. 11 is a block diagram of a TCSR block according to an exemplary embodiment of the inventive concept.

FIG. 11 is a block diagram of a TCSR block according to an exemplary embodiment of the inventive concept. Repeat descriptions of elements of FIG. 11 similar to those that have already been described with reference to FIG. 4 will be omitted.

Referring to FIG. 11, a TCSR block 270 may include a temperature sensor 272, an oscillator 274, a refresh control circuit 276, a counter 278, a comparator 279, and a set number of times generator (NP generator) 273.

The NP generator 273 may receive the temperature information TP provided from the temperature sensor 272 and output a corresponding set number of times NP to the comparator 279. In the present exemplary embodiment, the set number of times NP may decrease as the temperature information TP increases.

The counter 278 may receive the clock signal TCLK provided from the oscillator 274, count the number of cycles of the clock signal TCLK, and output the count value as the count signal CNT. In the present exemplary embodiment, the oscillator 274 may generate the clock signal TCLK having a cycle that does not change in accordance with the temperature information TP.

The comparator 279 may compare the count signal CNT, output from the counter 278, with the set number of times NP that varies according to the temperature information TP. By comparing the count signal CNT and the set number of times NP, the comparator 279 may output the period information PD_R differently according to whether or not the number of cycles of the clock signal TCLK is greater than the set number of times NP.

Figure 12:
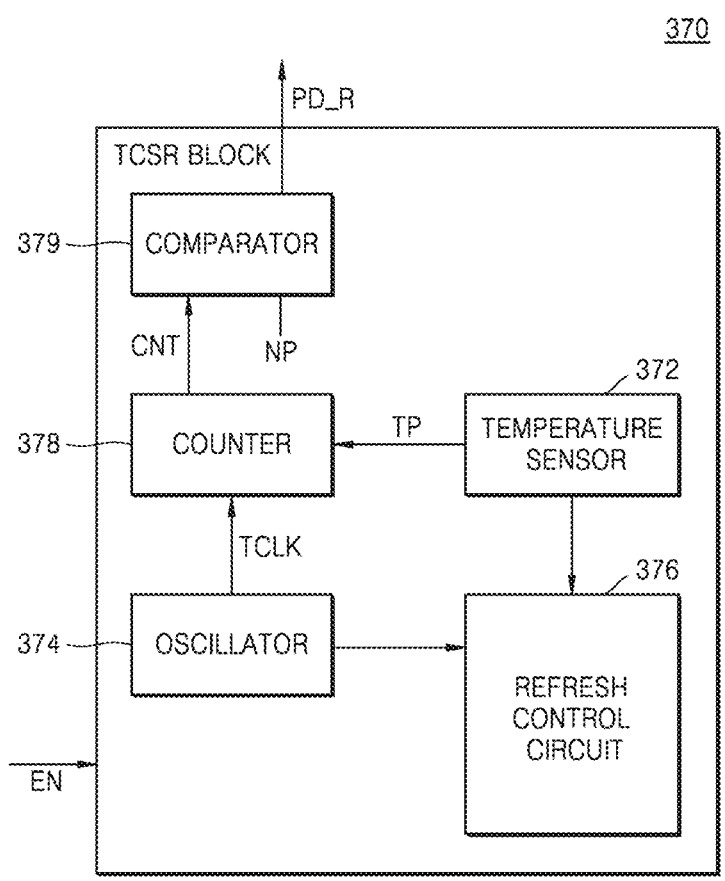
FIG. 12 is a block diagram of a TCSR block according to an exemplary embodiment of the inventive concept.

FIG. 12 is a block diagram of a TCSR block according to an exemplary embodiment of the inventive concept. Repeat descriptions of elements of FIG. 12 similar to those that have already been described with reference to FIG. 4 will be omitted.

Referring to FIG. 12, a TCSR block 370 may include a temperature sensor 372, an oscillator 374, a refresh control circuit 376, a counter 378, and a comparator 379.

The counter 378 may receive the clock signal TCLK provided from the oscillator 374 and the temperature information TP provided from the temperature sensor 372. In the present exemplary embodiment, the oscillator 374 may generate the clock signal TCLK having a cycle that does not change in accordance with the temperature information TP.

The counter 378 may count the number of cycles of the clock signal TCLK by changing a counting method according to the temperature information TP. In the present exemplary embodiment, a count frequency may be adjusted according to the temperature information TP, e.g., the count frequency may be increased as the temperature information TP increases.

Figure 13:
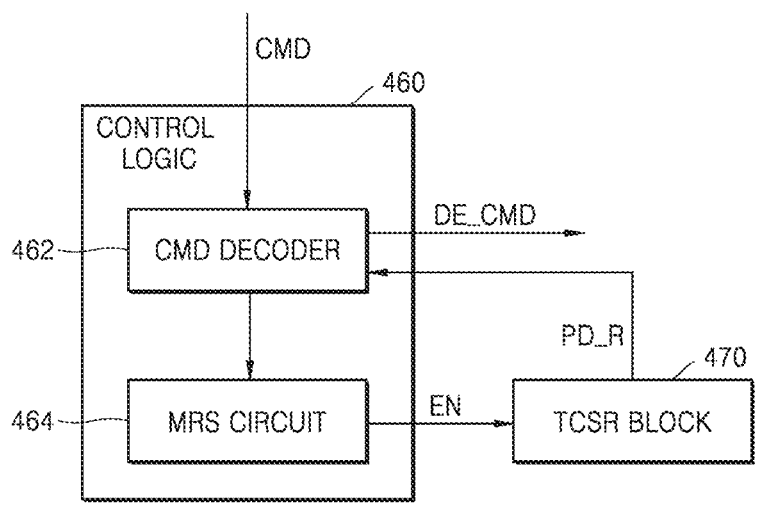
FIG. 13 illustrates external command control of a TCSR block according to an exemplary embodiment of the inventive concept.

FIG. 13 illustrates external command control of a TCSR block according to an exemplary embodiment of the inventive concept. Repeat descriptions of elements of FIG. 13 similar to those that have already been described with reference to FIG. 3 will be omitted.

Referring to FIG. 13, a TCSR block 470 may be connected to a control logic 460. The control logic 460 may include a CMD decoder 462 and an MRS circuit 464.

The TCSR block 470 may output the period information PD_R, which varies according to temperature information, to the CMD decoder 462. The CMD decoder 462 may receive the period information PD_R and the command CMD, and output the decoded command DE_CMD that is controlled according to the period information PD_R. In the present exemplary embodiment, the command CMD may be output from the command address buffer 140 of FIG. 3, and the decoded command DE_CMD may include a bit corresponding to a test-row-address (e.g., T_ROW_ADDR of FIG. 3) and/or a test-column-address (e.g., T_COL_ADDR of FIG. 3).

Figure 14:
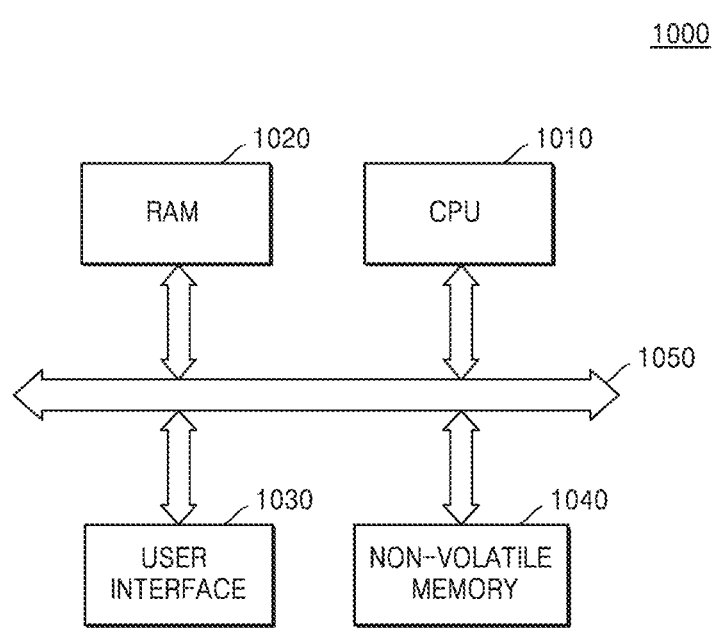
FIG. 14 is a block diagram of a computing system including a memory apparatus according to an exemplary embodiment of the inventive concept.

FIG. 14 is a block diagram of a computing system including a memory apparatus according to an exemplary embodiment of the inventive concept. A memory apparatus according to exemplary embodiments of the inventive concept may be mounted as a RAM 1020 in a computing system 1000, such as a mobile device or a desktop computer.

The computing system 1000 according to the present exemplary embodiment includes a central processing unit (CPU) 1010, the RAM 1020, a user interface 1030, and a non-volatile memory 1040, and each of the elements is electrically connected to a bus 1050. The non-volatile memory 1040 may be a mass storage such as a solid state drive (SSD) or a hard disk drive (HDD).

As described above, the memory apparatus included in the RAM 1020 may have a TCSR block that varies period information according to temperature information of the memory apparatus and outputs the period information in a test mode. Additionally, to adjust a refresh period for a memory cell array therein, the memory apparatus may include a CMD controller that controls an external command in response to the period information.

While the inventive concept has been shown and described with reference to exemplary embodiments thereof, it will be understood by those of ordinary skill in the art that various changes in form and details may be made thereto without departing from the spirit and scope of the inventive concept as defined by the following claims.

What is claimed is:

1. A memory apparatus comprising:
a memory cell array comprising a plurality of memory cells;
a temperature sensor configured to generate temperature information by measuring internal temperature of the memory apparatus;
a temperature compensated self refresh (TCSR) Hock configured to vary and output, in a test mode of the memory apparatus, period information for adjusting a refresh period for the memory cell array according to the temperature information;
a command controller configured to adjust, in response to the period information, the refresh period for the memory cell array by controlling an external command;
wherein the TCSR. block comprises:
an oscillator configured to vary and output a clock signal according to the temperature information; and
an output unit configured to receive the clock signal, and vary and output the period information according to the clock signal, and
wherein the output unit comprises:
a counter configured to receive the clock signal, and to perform a count operation to count a number of cycles of the clock signal and output a count signal; and
a comparator configured to receive the count signal, and to compare the count signal with a predetermined threshold value to vary and output the period information.

2. The memory apparatus of claim 1, wherein the refresh period for the memory cell array lengthens as the internal temperature increases, and
the refresh period for the memory cell array shortens as the internal temperature decreases.

3. The memory apparatus of claim 1, wherein the period information includes a first period and a second period within a cycle,
a refresh of the memory cell array is not performed during the first period,
the refresh of the memory cell array is performed during the second period, and
the first period is earlier than the second period.

4. The memory apparatus of claim 3, wherein a write operation is perforated on at least one memory cell among the plurality of memory cells, and the command controller or the TCSR block is enabled.

5. The memory apparatus of claim 4, wherein,
during the first period, the command controller blocks the external command, and
during the second period, the command controller terminates blocking the external command.

6. The memory apparatus of claim 4, wherein the external command is a refresh command.

7. The memory apparatus of claim 4, wherein,
during the first period, the command controller controls an operation corresponding to the external command, and
during the second period, the command controller substitutes the external command with a first internal signal.

8. The memory apparatus of claim 7, wherein the external command is an active command, and the first internal signal is a refresh command.

9. The memory apparatus of claim 4, wherein the external command is targeted at an adjacent memory cell disposed adjacent to the at least one memory cell on which the write operation has been performed.

* * * * *